(12) United States Patent
Breen et al.

(10) Patent No.: US 6,380,101 B1
(45) Date of Patent: Apr. 30, 2002

(54) METHOD OF FORMING PATTERNED INDIUM ZINC OXIDE AND INDIUM TIN OXIDE FILMS VIA MICROCONTACT PRINTING AND USES THEREOF

(75) Inventors: Tricia L. Breen, Tarrytown; Peter M. Fryer, Yorktown Heights; Ronald Wayne Nunes, Hopewell Junction, all of NY (US); Mary Elizabeth Rothwell, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/551,454

(22) Filed: Apr. 18, 2000

(51) Int. Cl.[7] .......................... H01L 21/31; H01L 21/469
(52) U.S. Cl. ....................... 438/765; 438/694; 438/767; 438/758; 438/770; 438/769
(58) Field of Search .................................. 438/765, 694, 438/767, 738, 769, 778, 758, 782, 770, 775, 903, 768, 771, 774, 745, 748, 749; 101/368, 378, 376, 379, 395, 401.1, 467; 118/723, 728, 612; 216/20, 33, 41, 44, 24

(56) References Cited

U.S. PATENT DOCUMENTS 5,512,131 A * 4/1996 Kumar et al. ................ 438/738
6,140,045 A * 10/2000 Wohlstadter et al. .......... 435/6

* cited by examiner

*Primary Examiner*—Matthew Smith
*Assistant Examiner*—Igwe U. Anya
(74) *Attorney, Agent, or Firm*—Thomas A. Beck; Daniel P. Morris

(57) ABSTRACT

Microcontact printing to pattern a self-assembled monolayer (SAM) of an alkanephosphonic acid on a film of indium zinc oxide (IZO). The SAM is robust enough to protect the undelying IZO from wet chemical etching, and thus defines a pattern of IZO on the substrate. In the microcontact printing process, a patterned, elastomeric stamp is inked with a solution of octadecylphosphonic acid and brought into conformal contact with the IZO surface. A SAM of alkanesulfonic acid forms where the stamp and the surface make contact; the rest remains underivatized. The stamp is then removed from the surface. Etching the sample in aqueous oxalic acid removes the unprotected areas, while the areas protected by the SAM remain in place.

19 Claims, 2 Drawing Sheets

METHOD OF FORMING PATTERNED INDIUM ZINC OXIDE AND INDIUM TIN OXIDE FILMS VIA MICROCONTACT PRINTING AND USES THEREOF

FIELD OF THE INVENTION

The present invention relates generally to derivatization and patterning of surfaces, and more particularly to the formation of self-assembled molecular monolayers on metal oxide surfaces using microcontact printing and derivative articles produced thereby.

BACKGROUND

In the field of microelectronic devices, sensors, optical elements and electronic displays, the development of devices that are conveniently and relatively inexpensively produced with a relatively low failure rate is important.

A well-known method of production of such devices is photolithography. According to this technique, a negative or positive resist (photoresist) is coated onto the exposed surface of a substrate. The resist is then irradiated in a predetermined pattern, and irradiated (positive resist) or nonirradiated (negative resist) portions of the resist are washed from the surface to produce a predetermined pattern of resist on the surface. This is followed by one or more procedures. For example, the resist may serve as a mask in an etching process in which areas of the material not covered by resist are chemically removed, followed by removal of resist to expose a predetermined pattern of the conducting, insulating, or semiconducting material on the substrate.

According to another example, the patterned surface is exposed to a plating medium or to metal deposition (for example, under a vacuum), followed by removal of the resist, resulting in a predetermined plated pattern on the surface of the material. In addition to photolithography, x-ray and electron-beam lithography have found analogous use.

While the above-described irradiative lithographic methods may be advantageous in many circumstances, all require relatively sophisticated and expensive apparatus to reproduce a particular pattern on a plurality of substrates. Additionally, they generally consume more reactants and produce more by-products in collateral fabrication steps than is optimal. Further, they are relatively time-consuming.

A need exists in the art for a convenient, inexpensive, and reproducible method of etching a surface according to a predetermined pattern. The method would ideally result in patterns having features in the micron and submicron domain, and would provide for convenient reproduction of existing patterns.

The study of self-assembled monolayers (SAMs) is an area of significant scientific research. Such monolayers are typically formed of molecules each having a functional group that selectively attaches to a particular surface, the remainder of each molecule interacting with neighboring molecules in the monolayer to form a relatively ordered array. Such SAMs have been formed on a variety of substrates including metals, silicon dioxide, gallium arsenide, and others. SAMs have been applied to surfaces in predetermined patterns in a variety of ways including simple flooding of a surface along with more sophisticated methods such as irradiative patterning and microcontact printing.

An example of a SAM that has been extensively studied and has been the subject of several patents is composed of a molecular species having a long-chain alkyl group and a thiol (—SH) group at one terminus. These SAMs are formed on metallic surfaces like gold, silver, copper, etc. For example, U.S. Pat. No. 5,512,131 to Kumar et al. describes patterned transfer of alkyl thiols to metallic surfaces such as gold. Other molecular species capable of forming SAMs on oxide surfaces usually contain, at one terminus, trichloro or trialkoxy silane groups that form covalent bonds with hydroxylated surfaces of metal oxides. The drawback of using silane-containing compounds is that these materials are very reactive, forming crosslinked structures in solution or on the surface of a stamp used for microcontact printing. Trichlorosilanes must be handled under an inert atmosphere to prevent their decomposition. A general description of patterning is found in U.S. Pat. No. 5,900,160 to Whitesides, et al. relating to methods of etching articles via microcontact printing..

Accordingly, a general purpose of the present invention is to solve problems associated with expense, complicated apparatus, and other complications associated with patterning indium zinc oxide (IZO) and indium tin oxide (ITO) surfaces for optical and electronic devices.

One object is to provide a method of conveniently and reproducibly producing a variety of SAM patterns on IZO and ITO surfaces, the pattern having resolution in the micron domain, and being amenable to etching.

Another general purpose of the invention is to provide electronic and optical elements and devices that are conveniently and inexpensively manufactured, and that are adaptable to a variety of systems.

SUMMARY

The method of patterning a metal oxide surface comprising the present invention, involves the steps of:

a) providing a solid substrate which may be a silicon wafer, glass, quartz, or polymeric materials such as polyimide, polyacrylate, and polyester coated with a thin metal oxide, preferably IZO and ITO, wherein the thickness of said metal oxide layer is from about 50 to about 1000 nm;

b) providing a stamp having a substantially continuous surface with at least one indentation, said indentation being formed by indenting means;

c) coating said stamp surface with a molecular species terminating in a functional group which is capable of reacting with said metal oxide surface to form a bond between said functional group and said metal oxide surface;

d) positioning said coated stamp on the surface of said metal oxide such that said functional group contacts and reacts with at least a portion of said metal oxide surface to form a bond therebetween;

e) removing said stamp from the surface of said metal oxide to obtain a self-assembled monolayer comprising the reaction product of said functional group of said molecular species and said metal oxide.

The non-contacted portion of said metal oxide surface which is not reacted with said molecular species, is removed by contact with an etchant.

The molecular species used in according with the present invention is an organic compound consisting of an alkyl group terminating with a phosphonic acid group and has the formula $[CH_3(CH_2)_nPO_3H_2]$, wherein in the alkyl portion, n=5–21.

Alternatively, the molecular species comprises an organic compound consisting of an alkyl group which is fully or partially fluorinated terminating with a phosphonic acid group and has the formula [$CF_3(CF_2)_m(CH_2)_n$—$PO_3H_2$], where n=0–20 and n+m=5–20.

The present invention provides a method of forming a patterned film of either IZO or ITO by microcontact printing and etching. The method involves contacting the surface of the IZO or ITO film with a stamp to transfer to it a self-assembled monolayer of a molecular species in a pattern. The self-assembled monolayer is contiguous with an exposed portion of the surface of the IZO or ITO film in a second pattern. The IZO or ITO film is removed from the underlying substrate, according to the second pattern, by contacting the exposed portion of the IZO or ITO film with an etchant that reacts chemically with the IZO or ITO and is inert with respect to the self-assembled monolayer.

Figure 1A:
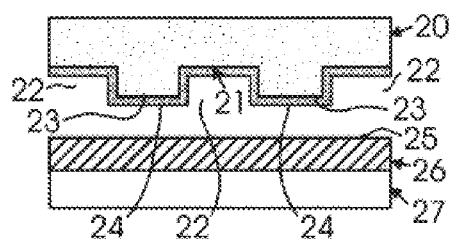
FIGS. 1a–f illustrate microcontact printing of a self-assembled molecular monolayer on the surface of a film of IZO or ITO on $Si/SiO_2$.

The various features of novelty which characterize the invention are pointed out with particularity in the claims annexed to and forming a part of the disclosure. For a better understanding of the invention, its operating advantages and specific objects attained by its use, reference should be had to the drawings and descriptive matter which are illustrated and described in the preferred embodiments of the invention.

DETAILED DESCRIPTION

Referring to FIGS. 1a–f, a method for forming a patterned film of IZO or ITO that uses microcontact printing is illustrated schematically. At FIG. 1a, a stamp 20 is illustrated having a surface 21 including a plurality of indentations 22 formed therein that form an indentation pattern. The indentations are contiguous with a stamping surface 23 that defines a stamping pattern.

Prior to microprinting, stamping surface 23, typically the entire surface 21 of the stamp, is coated with a molecular species 24. Molecular species 24 terminates in a phosphonic acid functional group, selected to bind to the IZO or ITO surface and to form an ordered self-assembled monolayer thereupon. Referring to FIGS. 1a–f, the phosphonic acid functional group at the terminus of species 24 is selected to bind to surface 25 of material 26 (IZO or ITO) provided on substrate 27, and to form a self-assembled monolayer on surface 25.

Figure 1B:
Figure 1B:
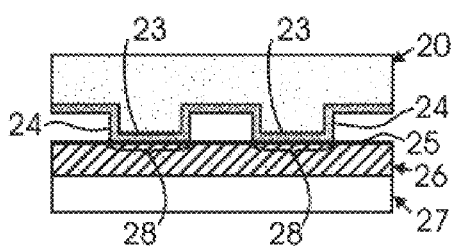

Referring to FIG. 1b, stamp 20 is placed, in a predetermined orientation, adjacent to substrate 27 such that stamping surface 23 contacts first portions 28 of article surface 25. Stamping surface 23 is held against portions of surface 25 of material 26 to hold molecular species 24 against the material surface to allow the phosphonic acid group to bind thereto.

Figure 1C:
Figure 1C:
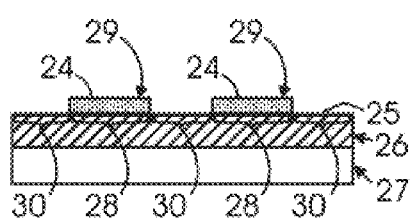
Figure 1D:
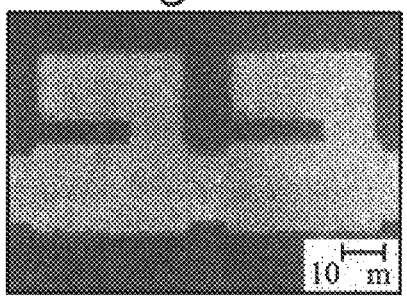

In FIG. 1c, stamp 20 has been removed from surface 25 to provide SAM 29 of the molecular species 24 on surface 25 according to the stamping pattern of stamping surface 23. Second portions 30 of surface 25, contiguous with first portions 28, remain free of molecular species 24. FIG. 1d is a scanning electron micrograph of a silicon article 27, coated with a thin layer of material 26 (IZO), upon the surface of which species 24 has been microcontact printed in accordance with the method illustrated in FIGS. 1a–c.

Figure 1E:
Figure 1E:
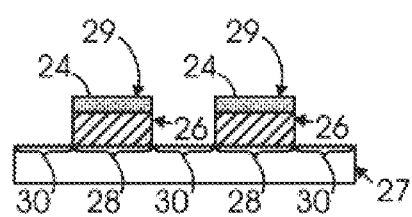
Figure 1F:
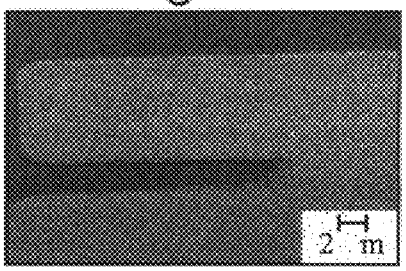

After removal of stamp 20, an etchant is applied to the surface. Species 24 is undisturbed by the etchant, and therefore the etchant does not attack the area of surface 25 that is covered by species 24. The etchant contacts surface 25 of material 26 on substrate 27 via gap 30, and dissolves material 26 at gap 30. The pattern of stamping surface 23 is thus transferred to the film of material 26. The result is illustrated in FIG. 1e. A scanning electron micrograph of material 26 (IZO) on silicon substrate 27 that has been patterned according to the embodiment illustrated is shown in FIG. 1f.

Molecular species 24 may be coated onto stamping surface 23 by any convenient method, for example, molecular species 24 may be sprayed onto stamping surface 23. Alternatively, a cotton swab or the like may be used to transfer molecular species 24 to stamping surface 23, or molecular species 24 may be absorbed into a piece of paper, and stamping surface 23 may then be pressed against the piece of paper.

Generally, molecular species 24 is dissolved in a solvent for transfer to stamping surface 23. The concentration of molecular species 24 in such a solvent for transfer should be selected to be low enough that a well-defined SAM may be transferred to surface 25 without blurring, and high enough that the SAM protects underlying surface 25 from the etchant. Typically, species 24 will be transferred to stamping surface 23 in a solvent at a concentration of less than 100 mM, preferably from about 0.5 to about 20.0 mM, and more preferably from about 1.0 to about 10.0 mM. Any organic solvent within which molecular species 24 dissolves is suitable. When molecular species 24 is transferred to stamping surface 23, either near or in a solvent, the stamping surface should be dried before the stamping process is carried out. If stamping surface 23 is not dry when the SAM is stamped onto the material surface, that is, if gross liquid remains on the stamping surface, blurring of the SAM will result from dispersion of the liquid from under the stamping surface. Stamping surface 23 may be air dried, blow dried, or dried in any other convenient manner. The drying manner should simply be selected so as not to degrade the SAM-forming molecular species.

The film of material 26 is deposited, by any convenient method such as sputtering, on any convenient substrate, for example, silicon, silicon dioxide etc. The thickness of the film of material 26 is typically less than 500 nm, preferably from about 25 to about 100 nm, and more preferably from about 50 to about 75 nm.

According to another embodiment of the invention, SAM 29 is formed over the entirety of surface 25. For example, SAM 29 may be formed by immersing surface 25 in a solution of molecular species 24. Alternatively, a stamp in which stamp surface 21 does not include any indentations may be used in a microcontact printing process as in FIG. 1.

The function and advantage of these and other embodiments of the present invention will be more fully understood from the examples below. The following examples are intended to illustrate the benefits of the present invention, but do not exemplify the full scope of the invention.

EXAMPLE 1

Fabrication of a Microcontact Printing Stamp

A template consisting of an exposed and developed photoresist pattern was fabricated by photolithography. A 2-mm-high border was formed by fixing strips of 2-mm-thick adhesive-backed foam around the perimeter of the surface of the template. A 10:1 (w:w or v:v) mixture of PDMS-Sylgard Silicone Elastomer 184 and Sylgard Curing Agent 184 (Dow Corning Corp., Midland, Mich.) was degassed under vacuum for about 10 minutes, then the mixture was poured over the template to approximately the height of the foam border. The PDMS cured at 65° C. for 60 minutes. After cooling to room temperature, the PDMS-stamp was carefully peeled from the template.

EXAMPLE 2

Patterning IZO Films by Microcontact Printing and Wet Etching

Figure 2A:
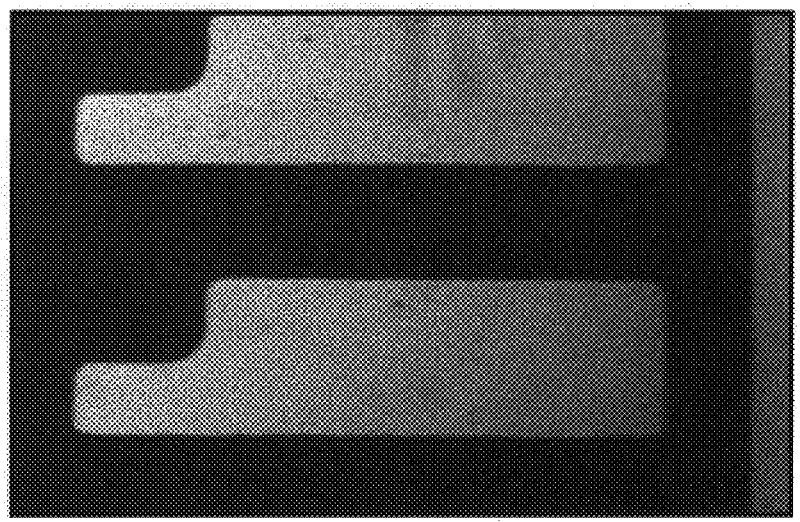
FIGS. 2a–b illustrate IZO surfaces derivatized using the technique illustrated in FIGS. 1a–f.
Figure 2B:
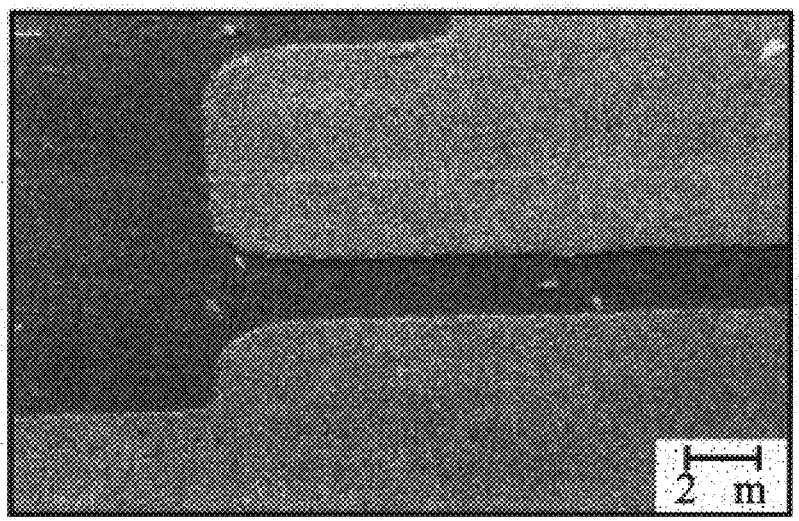

A stamp fabricated in accordance with Example 1 was made. The stamp was fabricated so as to have an array of pixels surrounded by indented regions. That is, the stamp had a pattern of indentations separating stamping surface pixels. The surface was coated with octadecylphosphonic acid in ethanol by applying a small volume of solution to cover the surface of the stamp. After allowing the solution to contact the surface of the stamp for 30 s, the stamp surface was dried under a stream of dry dinitrogen. The stamp was applied to an IZO surface and removed, whereby a pattern of alkanephosphonic acid is formed. The remaining unprotected IZO was removed from the surface of the silicon substrate using an aqueous oxalic acid solution (10% w:v), thus transferring the pattern of the stamp to the IZO film. An optical micrograph of the resultant pattern is shown in FIG. 2a and a scanning electron micrograph in FIG. 2b.

EXAMPLE 3

Patterning ITO Films by Microcontact Printing and Wet Etching

A stamp fabricated in accordance with Example 1 was made. The procedure of Example 2 above was followed and a similar result obtained. The pattern of the stamp was transferred to the ITO film. An optical micrograph of the resultant pattern was similar to that shown in FIG. 2a and a scanning electron micrograph obtained was similar to that shown in FIG. 2b.

Thus while there have been shown and described and pointed out fundamental novel features of the invention as applied to currently preferred embodiments thereof, it will be understood that various omissions and substitutions and changes in the form and details of the method and apparatus illustrated, and in their operation, may be made by those skilled in the art without departing from the spirit of the invention. In addition, it is to be understood that the drawings are not necessarily drawn to scale but that they are merely conceptual in nature. It is the inention, therefore, to be limited only as indicated by the scope of the claims.

What we claim and desire to protect by letters patent is:

1. A method of patterning a metal oxide surface at ambient pressure, comprising steps of:
    a) providing a substrate coated with a metal oxide selected from the group consisting of indium zinc oxide and indium tin oxide;
    b) providing a stamp having a substantially continuous surface with at least one indentation;
    c) coating said stamp surface with a molecular species comprising an alkyl group which is fully or partially fluorinated terminating with a phosphoric acid group and has the formula $(CF_3(CF_2)_m(CH_2)_n)$, where n+m= 0–20 which molecular species is capable of reacting with said metal oxide surface to form a bond between said phosphoric acid group and said metal oxide surface;
    d) positioning said coated stamp on the surface of said metal oxide such that said phosphoric acid group contacts and reacts with at least a portion of said metal oxide surface to form a bond therebetween;
    e) removing said stamp from the surface of said metal oxide to obtain a self-assembled monolayer comprising the reaction product of said phosphoric acid group of said molecular species and said metal oxide.

2. The method defined in claim 1 wherein said molecular species which is capable of reacting with said metal oxide surface to form a bond between said molecular species and said metal oxide surface is dissolved in a solvent which is used to coat said stamp surface.

3. The method defined in claim 2 wherein the concentration of said molecular species which is capable of reacting with said metal oxide surface to form a bond between said molecular species and said metal oxide surface dissolved in said solvent is less than 100 mM.

4. The method defined in claim 3, wherein the concentration of said molecular species in said solvent is between about 0.5 mM and about 20 mM.

5. The method defined in claim 3, wherein the concentration of said molecular species in said solvent is between about 1.0 mM and about 10 mM.

6. The method defined in claim 1 wherein the non-contacted portion of said metal oxide surface which is not reacted with said molecular species, is removed by contact with an etchant.

7. The method defined in claim 1 wherein said molecular species comprises an alkyl group terminating with a phosphonic acid group and has the formula $[CH_3(CH_2)_nPO_3H_2]$, wherein in the alkyl portion, n=5–21.

8. The method defined in claim 1, wherein said molecular species comprises an alkyl group which is fully or partially fluorinated terminating with a phosphonic acid group and has the formula $[CF_3(CF_2)_m(CH_2)_n—PO_3H_2]$, where n=0–20 and n+m=5–20.

9. A method defined in claim 1 wherein said oxide surface is a thin film of said oxide deposited on a solid substrate selected from the group consisting of silicon wafer, glass, quartz, polyimide, polyacrylate, and polyester.

10. The method defined in claim 9 wherein the thickness of said metal oxide surface is 50–1000 nm.

11. The method defined in claim 10 wherein said metal oxide is indium-doped zinc oxide.

12. The method defined in claim 11 wherein patterning of said indium-doped zinc oxide comprises the steps of:
    a) positioning said stamp coated with said molecular species on the surface of said indium-doped zinc oxide, and then contacting selected portions of said indium-doped zinc oxide surface to allow said portions to react with said molecular species;
    b) removing said stamp from the surface of indium-doped zinc oxide to obtain a self-assembled monolayer comprising the reaction product of said functional group of said molecular species and said indium-doped zinc oxide surface;
    c) removing with an etchant the non-contacted portions of indium-doped zinc oxide which is not reacted with bound molecular species, to form patterns of said indium-doped zinc oxide on said substrate.

13. The method defined in claim 12, wherein the patterned substrate is used in the fabrication of optoelectronic devices like liquid crystal displays.

14. The method defined in claim 11 wherein portions of an indium-doped zinc oxide on a silicon wafer substrate are not reacted with said alkyl group terminating with a phosphonic acid group are removed by an etchant to form patterns of said indium-doped zinc oxide.

15. The method defined in claim 10 wherein said metal oxide is indium-doped tin oxide.

16. The method defined in claim 15 wherein patterning of said indium-doped tin oxide comprises the steps of:
   a) positioning said stamp coated with said molecular species on the surface of said indium-doped tin oxide, and then contacting selected portions of said indium-doped tin oxide surface to allow said portions to react with said molecular species;
   b) removing said stamp from the surface of said indium-doped tin oxide to obtain a self-assembled monolayer comprising the reaction product of said functional group of said molecular species and said indium-doped tin oxide surface;
   c) removing with an etchant the non-contacted portions of indium-doped tin oxide which is not reacted with said bound molecular species, to form patterns of said indium-doped tin oxide on said substrate.

17. The method defined in claim 16, wherein the patterned substrate is used in the fabrication of optoelectronic devices like liquid crystal displays.

18. The method defined in claim 15 wherein portions of an indium-doped tin oxide on a silicon wafer substrate are not reacted with said alkyl group terminating with a phosphonic acid group are removed by an etchant to form patterns of said indium-doped tin oxide.

19. The method defined in claim 1 wherein said indentation is formed by lithographic, x-ray and electron-beam lithography.

* * * * *